United States Patent [19]
Kim

[11] Patent Number: 6,009,181
[45] Date of Patent: Dec. 28, 1999

[54] METHOD OF CONTROLLING SOUND IN COMPUTER MONITOR WITH SOUND PROCESSING FUNCTIONS

[75] Inventor: Young-Chan Kim, Anyangshi, Rep. of Korea

[73] Assignee: SamSung Electronics Co., Ltd., Suwon, Rep. of Korea

[21] Appl. No.: 08/857,861

[22] Filed: May 16, 1997

[30] Foreign Application Priority Data

May 16, 1996 [KR] Rep. of Korea ..................... 96-16513

[51] Int. Cl.⁶ .................................................. H03G 3/00
[52] U.S. Cl. ........................... 381/109; 381/306; 381/26; 381/333
[58] Field of Search .................................... 381/104–109, 381/102, 1, 306, 333, 119, 26, 91, 111; 364/400.01

[56] References Cited

U.S. PATENT DOCUMENTS

| | | |
|---|---|---|
| 4,611,344 | 9/1986 | Hayama et al. . |
| 5,179,238 | 1/1993 | Hotta ........................................ 84/478 |
| 5,189,705 | 2/1993 | Lavaud . |
| 5,255,324 | 10/1993 | Brewer et al. . |
| 5,363,147 | 11/1994 | Joseph et al. . |
| 5,448,620 | 9/1995 | Gershkovich et al. . |
| 5,530,767 | 6/1996 | Yoshida . |
| 5,579,404 | 11/1996 | Fielder et al. . |
| 5,615,256 | 3/1997 | Yamashita . |

*Primary Examiner*—Ping Lee
*Attorney, Agent, or Firm*—Robert E. Bushnell, Esq.

[57] ABSTRACT

Method of controlling sound is performed in a computer monitor having sound processing function, and comprises the step of modifying a volume limit value, i.e., a maximum sound volume value adaptive to the incorporated software and/or hardware of the personal computer so as not to generate howling in the monitor. The method is accomplished by a microcomputer. With the method, when a volume limit level modifying signal to modify the volume limit value is externally applied, the microcomputer neglects a previously set volume limit value and stores a new volume limit value which is adjusted by an operator.

15 Claims, 7 Drawing Sheets

METHOD OF CONTROLLING SOUND IN COMPUTER MONITOR WITH SOUND PROCESSING FUNCTIONS

CLAIM OF PRIORITY

This application makes reference to, incorporates the same herein, and claims all benefits accruing under 35 U.S.C. §119 from an application entitled Method of Controlling Sound in Computer Monitor with Sound Processing Functions earlier filed in the Korean Industrial Property Office on the 16th day of May 1996, and there duly assigned Serial No. 96-16513 by that Office.

1. Field of the Invention

The present invention relates to a process and apparatus for controlling a monitor providing visual displays for use with a personal computer, such as a laptop computer or a desktop computer, and, more particularly, to processes and apparatus for controlling sound broadcast by monitors equipped with a cathode ray tube providing sound processing functions.

2. Background of the Invention

A typical computer monitor with sound processing functions has various sound control buttons and an incorporated microphone, a microphone control switch for turning the volume of the microphone on and off, volume control buttons used to increase and lower sound volume, and a mute button. An external mike input jack and a headphone jack are also provided. A computer monitor also has, on the rear panel, a power input jack, a sound input jack receiving an audio signal applied externally, a mike output jack providing an audio signal collected by the microphone to an external system, and a signal input connector receiving video and horizontal/vertical synchronization signals I have noticed that whenever the incorporated microphone or an external microphone connected to the external mike input jack is turned on and off, howling occurs when sound volume of the loud speakers is increased above a specific level because a sound signal from the speakers is introduced into the microphone so that the sound volume of the speakers is abnormally amplified. Accordingly, to prevent howling, a maximum volume level that does not cause howling whenever the microphone is turned on or off, must be set as a volume limit level. If the sound volume is above the volume limit level (howling limit level) whenever the microphone is turned on, or if the mike is turned on when the sound volume is above the volume limit level, howling occurs.

So as to prevent such howling, a conventional method often followed in the art is to control amplitude gain of an audio amplifier incorporated in the monitor in order that, as the sound volume is gradually increased during when turning the microphone on, the sound volume will not be amplified by more than a fixed value of the volume limit level. Also, if the microphone is turned on while the sound volume is maintained above a practical volume limit level, the amplitude gain can be controlled with the conventional method in order that the sound volume is no more than a predetermined volume limit level. I have found however, that according to this conventional sound controlling method, the maximum volume level that does not cause howling may be practically varied in accordance with the type of software to be executed in a personal computer connected with the above computer monitor, chipset of sound card mounted therein or the like. Consequently, if the volume limit level has previously be set to a specific value, the sound volume may be increased more than a practical volume limit level changed in accordance with the variation. As a result, howling will occur. Also, if some software or a sound card has been installed in a personal computer, when the volume limit level is set to a level sufficient low enough to not precipitate the occurrence of howling, I have noticed that the sensitivity of the microphone is lowered.

Among the contemporary art on this matter of resetting sound volume limits on an electronic device, especially those involving a monitor and a computer algorithm, Yamashita (U.S. Pat. No. 5,615,256, Device And Method For Automatically Controlling Sound Volume In A Communication Apparatus, Mar. 25, 1997) discusses a sound volume controller. A level of the averaged amplitude is determined by comparing the averaged amplitude with at least one predetermined reference level. Fielder et al. (U.S. Pat. No. 5,579,404, Digital Audio Limiter, Nov. 26, 1996) discusses a signal processing system. Split-band perceptual coders can receive a peak amplitude limited input audio signal and can process the signal in such a manner that the processing signal preserves the apparent loudness of the input signal but is no longer peak-amplitude limited. Yoshida (U.S. Pat. No. 5,530,767, Reception Volume Limiting Circuit, Jun. 25, 1996) discusses a reception volume limiting circuit. If the time average value exceeds the threshold value, the control section calculates an excess level from the difference between the two values, stores the excess level as a current attenuation amount. Gershkovich et al. (U.S. Pat. No. 5,448,620, Volume Control For Dual Mode Communications Device, Sep. 5, 1996) discusses a communication device. At least during an initial period of operation in either of the two operating modes, audio signals of relatively high level do not originate from the ear-piece, thereby preventing a change in audio power output from the ear-piece that may potentially cause damage to the hearing of a user of the radio communications device. Joseph et al. (U.S. Pat. No. 5,363,147, Automatic Volume Leveller, Nov. 8, 1994) discusses a circuit for controlling a reproduced volume level of an audio signal to a desired level. The circuit includes a peak detector for detecting a peak amplitude level in the audio signal and a comparatior for comparing the detected peak amplitude level in the audio signal with the desired amplitude level. Lavaud (U.S. Pat. No. 5,189,705, Audio Equipment, Feb. 23, 1993) discusses an arrangement for adjusting the volume of a played back signal by a microprocessor from an audio system. Hayama et al. (U.S. Pat. No. 4,611,344, Electronic Volume Control Circuit, Sep. 9, 1986) discusses an electronic volume circuit in which the volume setting can be finely controlled, regardless of the level of the input signal. From my study of the contemporary art and practice, I have found that there is a need for an effective and improved method and apparatus for resetting sound volume in an electronic device, especially those with a display monitor connected to a computer and using an effective algorithm.

SUMMARY OF THE INVENTION

It is therefore an object of the present invention to provide a method of controlling sound in a computer monitor having sound processing functions so as not to occur howling therein.

It is another object to provide a method of controlling sound in a computer monitor, wherein a volume limit level can be adaptively modified in accordance with the sorts of software or a chipset of sound card incorporated in a personal computer.

In order to accomplish the above objects, a technique of controlling sound in the practice of this invention is provided for a computer monitor having a sound processing device. This technique contemplates reading previously stored volume limit information from a memory of the sound processing circuit when a volume limit level modifying signal is applied to the microcomputer in accordance with key entry of an operator; determining whether modification of the previously stored volume limit information to new volume limit information is canceled. If modification is indicated, then terminating the sound controlling method; if modification is not indicated, then determining whether a volume-up operation is requested; performing the volume-up operation, if the volume-up operation is requested, to modify the previously stored volume limit level and generate a modified volume limit level; determining whether a volume-down operation is requested; performing the volume-down operation, if the volume-down operation is requested, to modify the previously stored volume limit level and generate the modified volume limit level; determining whether the modified volume limit level is identical with the new volume limit information; and storing the modified volume limit level in the memory if the modified volume limit level is identical with the new volume limit information.

This technique also contemplates, after storing the modified volume limit level, adjusting an output sound volume of the monitor. The step of adjusting the output sound volume checks whether the output sound volume is more than the modified volume limit level when the microphone is turned on; adjusting the output sound volume to no more than or equal to the modified volume limit level; and allowing, if not, the output sound volume to continue to be maintained.

Also, this technique contemplates, after storing the modified volume limit level, checking whether the microphone is turned on; checking, if so, whether an output sound volume is less than the modified volume limit level or checking, if not whether the output sound volume is identical with a maximum volume level; and increasing the output volume.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 1 illustrates a typical display monitor having multimedia functions so as to explain a conventional method of controlling sound therein, wherein

DETAILED DESCRIPTION OF PREFERRED EMBODIMENTS

Figure 1A:
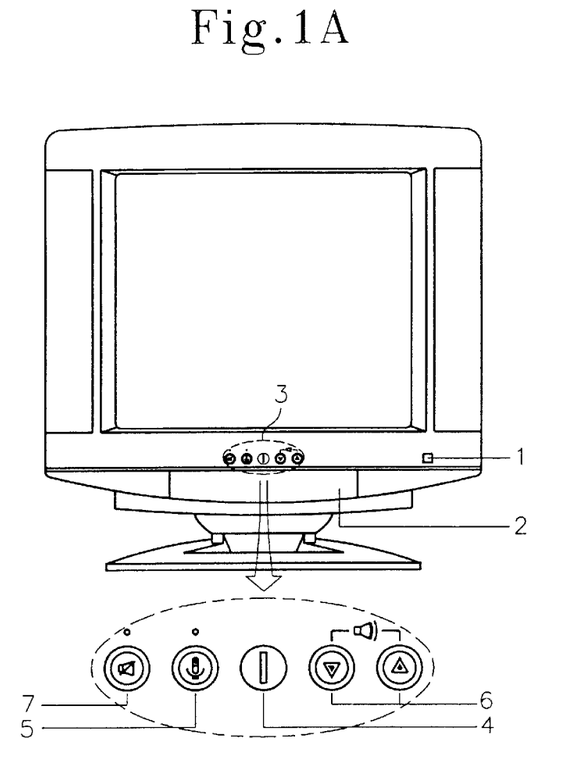
FIG. 1A is a front view of the conventional display monitor.

A typical computer monitor with sound processing functions has, as shown in FIG. 1A, a power button 1, a front control panel 2 and various sound control buttons 3 on the front vessel thereof. The front control panel 2 is provided to control various control functions of the monitor, such as contrast, brightness, color temperature, horizontal/vertical size, horizontal/vertical position and the like. So as to control sound, the computer monitor also has an incorporated mike (microphone) 4, a mike control switch 5 for turning on/off the mike 4, volume control buttons 6 used to increase and lower sound volume, and a mute button 7, as shown in FIG. 1A.

Figure 1B:
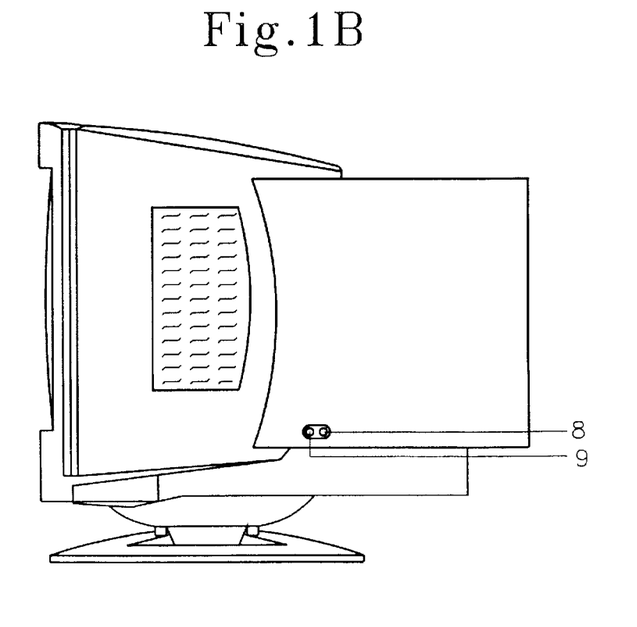
FIG. 1B is a side view thereof and FIG. 1C is a rear view thereof.
Figure 1C:
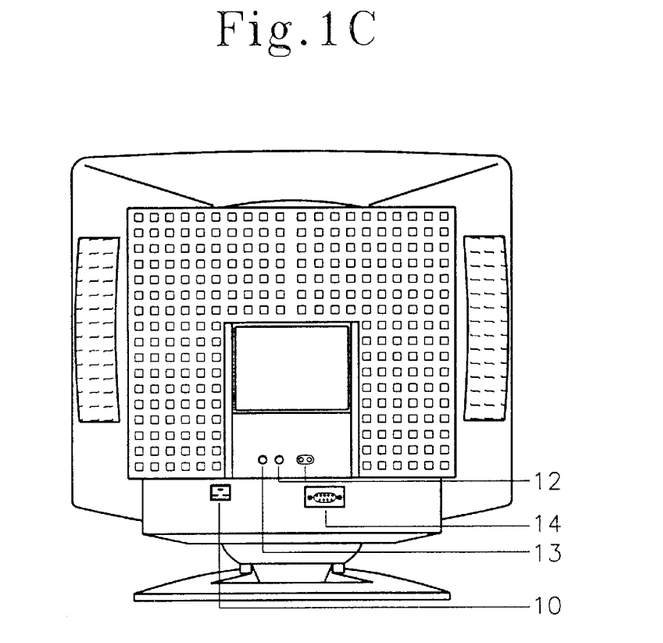

On one side panel of the computer monitor, as shown in FIG. 1B, an external mike input jack 8 and a headphone jack 9 are provided. The computer monitor also has, on the rear panel thereof as shown in FIG. 1C, a power input jack 12, a sound input jack 12 for receiving an audio signal applied externally, a mike output jack 13 for providing an audio signal collected by the mike 4 to an external system (not shown), and a signal input connector 14 for receiving video and horizontal/vertical synchronization signals.

In the above described computer monitor, during the turning on of the incorporated mike 4 or an external mike connected to the external mike input jack 8, howling occurs when sound volume of the loud speakers is increased above a specific level. Such howling occurs. Also, such howling occurs even when the mike is turned on at sound volume of more than a specific level. This is because a sound signal from the speakers is introduced into the mike so that the sound volume of the speakers can be abnormally increased. Accordingly, so as to prevent howling, a howling prevention level, i.e., a maximum volume level that does not cause howling during the turning on of a mike, must be set as a volume limit level.

Figure 2:
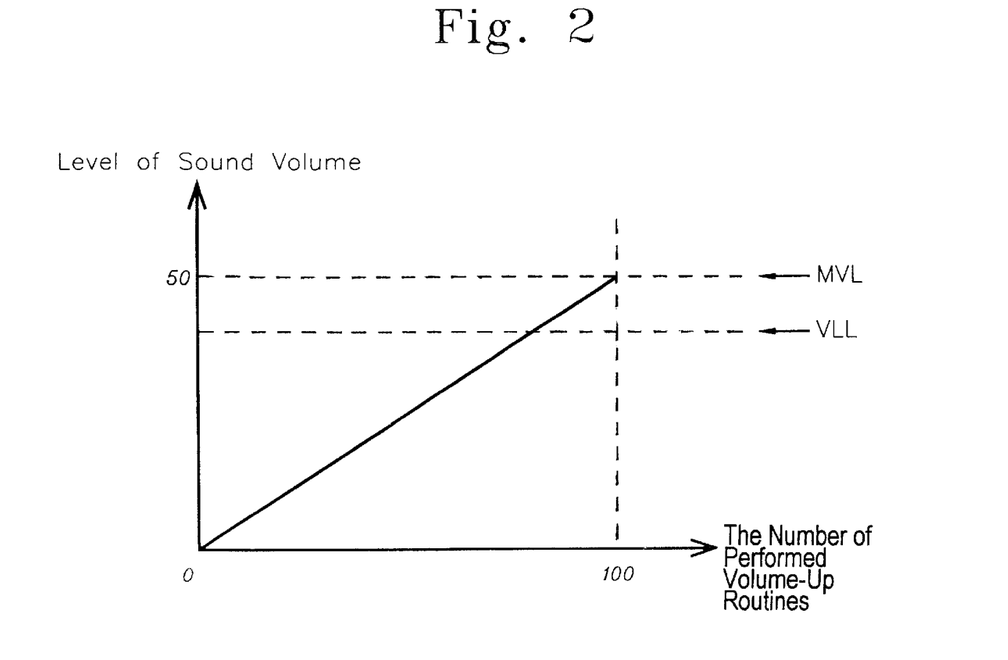
FIGS. 2 through 4 are graphs showing the relationship between a sound volume level and the number of performed volume-up routines so as to explain the conventional sound controlling method.

FIG. 2 shows the relationship between the level of sound volume and the number of performed sound volume-up routines. In FIG. 2, reference symbols MVL and VLL represent a maximum volume level and a volume limit level, respectively. It can be understood from FIG. 2 that sound volume is set to the maximum volume value MVL, i.e., 50, when the volume-up routines are repeatedly performed 100 times. If the sound volume is above the volume limit level (howling limit level) during the turning on of the mike, or if the mike is turned on when the sound volume is above the volume limit level, the howling is generated.

Figure 3:
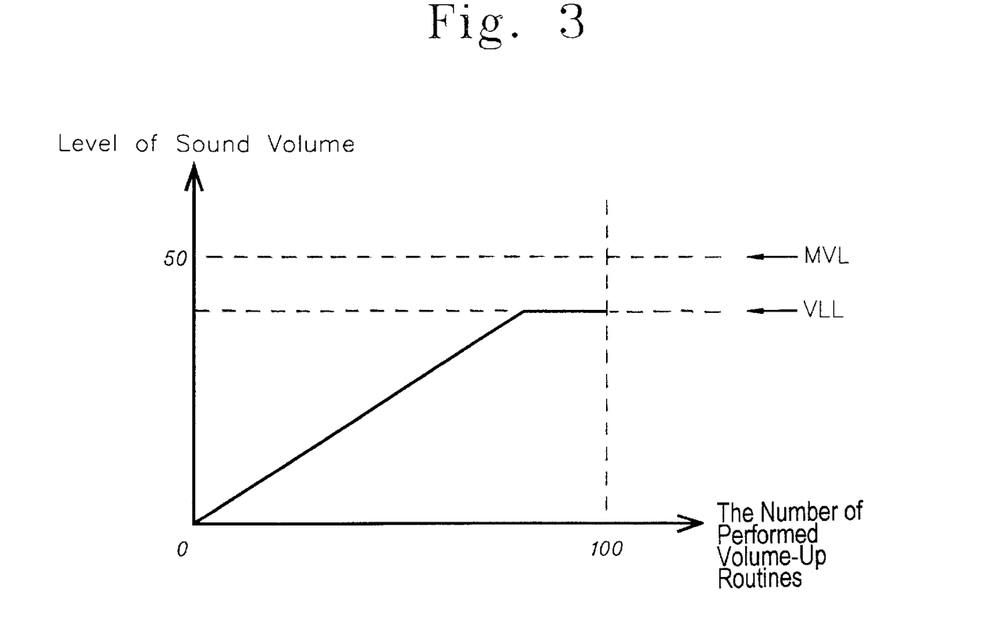

So as to prevent such howling, a conventional method well-known in the art is to control amplitude gain of an audio amplifier incorporated in the monitor in order that, when the sound volume is gradually increased during the turning on of the mike as shown in FIG. 3, the sound volume becomes no more than a fixed value of the volume limit level. Also, if the mike is turned on while the sound volume is maintained above a practical volume limit level as shown in FIG. 4, the amplitude gain can be controlled with the conventional method in order that the sound volume is no more than a predetermined volume limit level, i.e., a sound volume level between the maximum volume level MVL and the practical volume limit level VLL.

Figure 4:
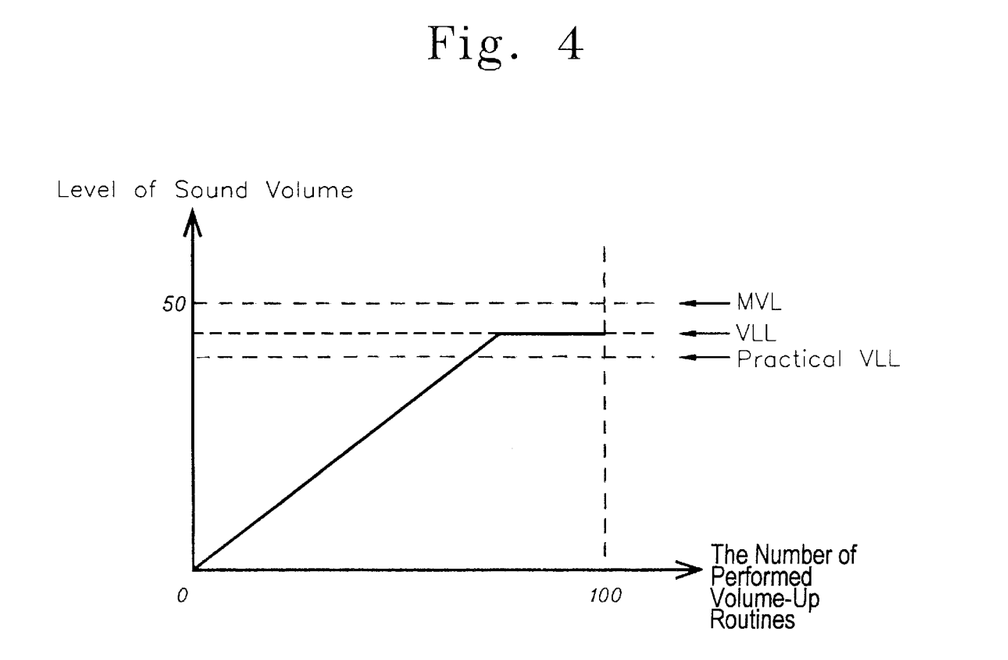

However, according to the conventional sound controlling method, the maximum volume level that does not cause howling may be practically varied in accordance with the sorts of software to be executed in a personal computer connected with the above computer monitor, chipset of sound card mounted therein or the like, as shown in FIG. 4. Thus, if the volume limit level is previously fixed to a specific value, the sound volume may be increased more than a practical volume limit level changed in accordance with the variation. As a result, howling has occurred.

Also, in case that some software or a sound card is embodied in the personal computer, if the volume limit level is set to a lower level sufficient enough not to occur howling, there rises a new problem that sensitivity of the mike is lowered.

Figure 5:
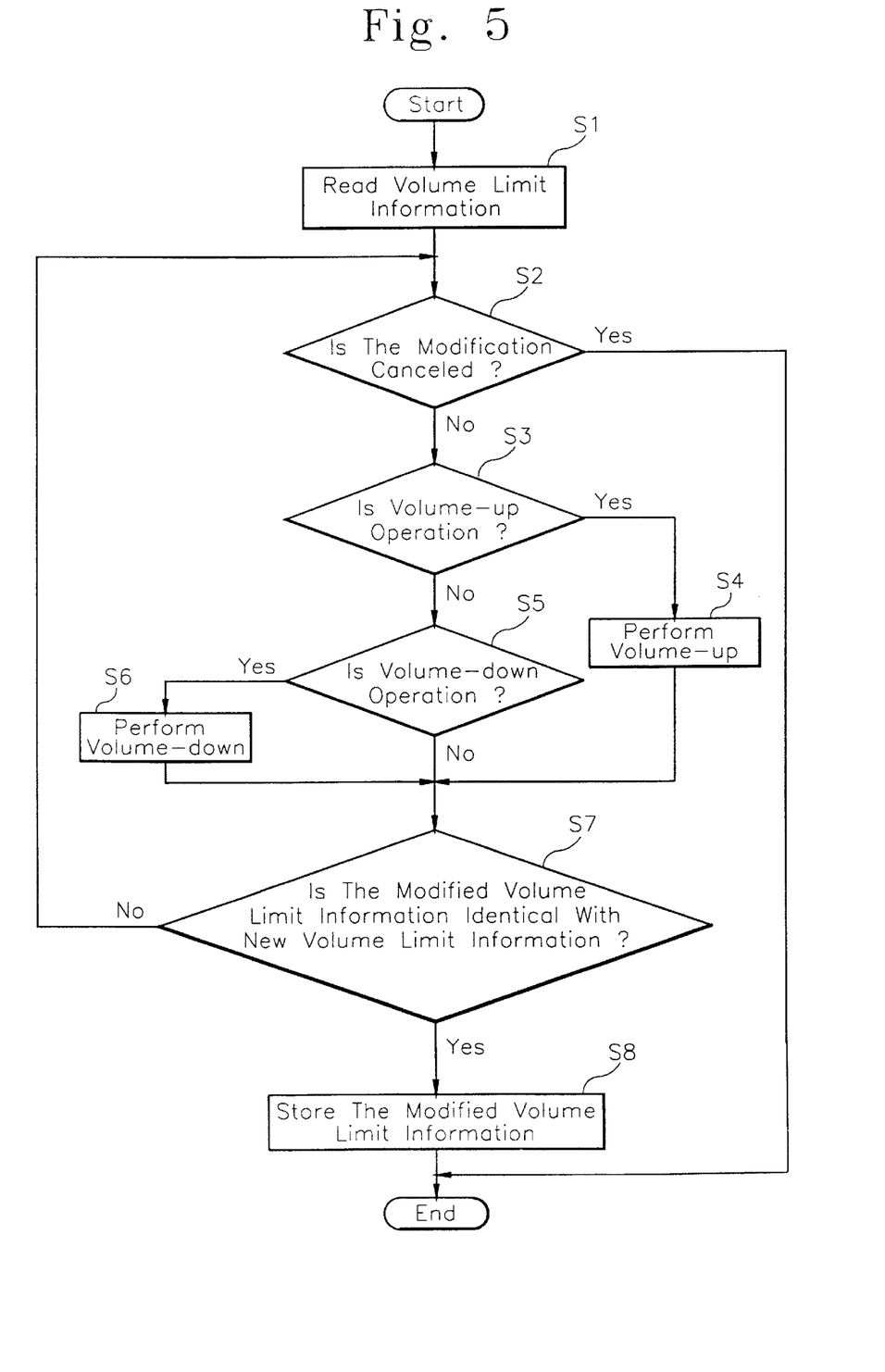
FIG. 5 is a flow chart showing process steps of a novel method of controlling sound in a computer monitor in accordance with an embodiment of the present invention.

FIG. 5 shows, in flow chart form, a control program which is executed in a microcomputer so as to accomplish a sound controlling method of the present invention.

Referring to FIG. 5, the novel method of controlling sound in a computer monitor comprises the step of modifying a volume limit value, i.e., a maximum sound volume value adaptive to the incorporated software and/or hardware of a personal computer so as not to generate howling in the monitor. The novel sound controlling method is accomplished by a microcomputer 40 (referring to FIG. 9) which has a memory (not shown) for storing the control program executing the novel sound controlling method and some information, such as a volume limit value and the like. According to the sound controlling method, when a command (i.e., a volume limit level modifying signal) to modify the volume limit value is externally applied, the microcomputer 40 neglects a previously set volume limit value and stores a new volume limit value which is adjusted by an operator. Also, if a modification canceling signal is applied to the microcomputer 40 during the modification of the previously set volume limit value to the new volume limit value, the previously set volume limit value is restored. By the above described method, a volume limit value can be adaptively modified by a user in accordance with the incorporated software and/or the hardware chipset, such as a sound card. As a result, howling is not generated in the computer monitor and sensitivity of a mike is not lowered.

Figure 9:
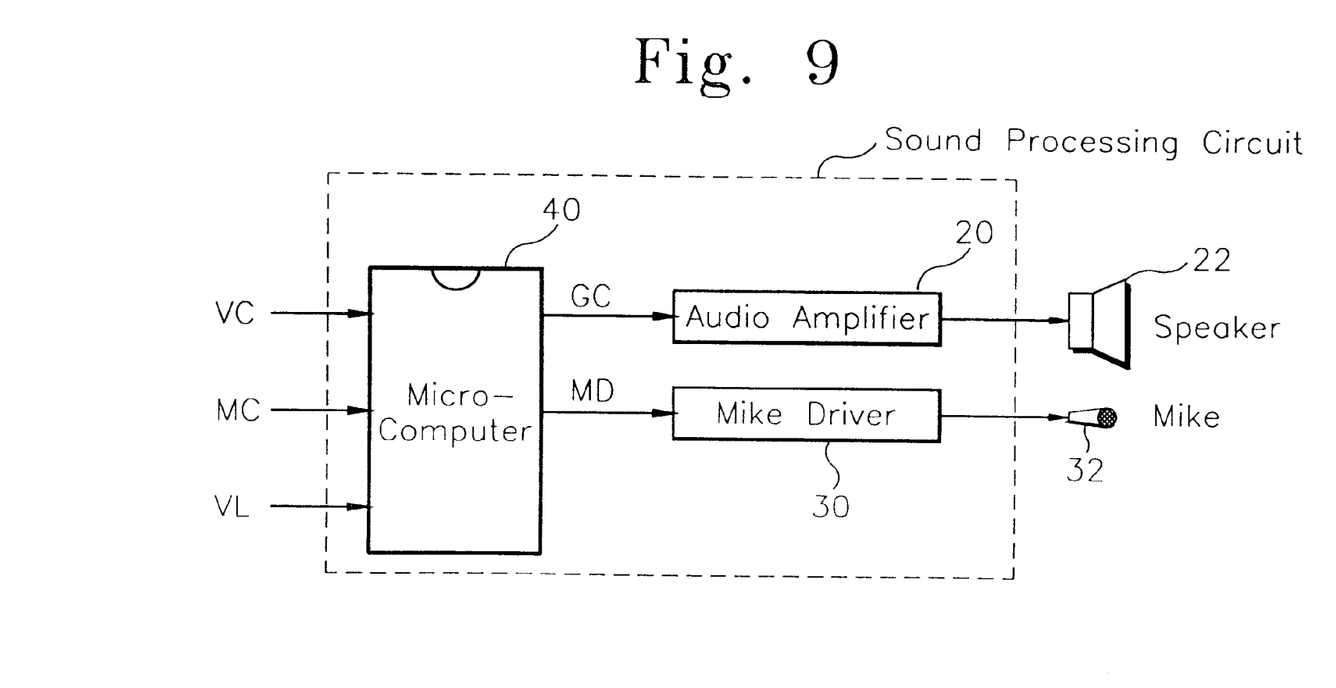
FIG. 9 is a block diagram showing a sound processing circuit of the computer monitor in which the sound controlling method is incorporated.

FIG. 9 shows a sound processing circuit in which the sound controlling method of the present invention is incorporated. The microcomputer 40 receives, as shown in FIG. 9, several control signals, such as a volume control signal VC, a mike control signal MC and a volume limit level modifying signal VL and the like, from a monitor controller (not shown) or other control circuits. The volume control signal VC is generated from a volume control circuit (not shown) associated with a volume control button and the mike control signal MC is generated from a mike control circuit (not shown). The control circuits may be incorporated in the monitor controller. The microcomputer 40 has two sound output signals, one of which is a gain control signal GC and the other is a mike driving signal MD. An audio amplifier 20 amplifies an audio signal in accordance with the gain control signal GC and provides an amplified audio signal to a speaker 22. A mike driving circuit 30 allows a mike 32 to be switched on/off in accordance with the mike driving signal MD. The microcomputer 40, the audio amplifier 20 and the mike driving circuit 30 constitute the sound processing circuit.

Referring again to FIGS. 5 and 9, if the control of modifying a volume limit level is performed in accordance with key entry of an operator, i.e., when a volume limit level modifying signal VL is applied to the microcomputer 40, the control proceeds to step S1, wherein the microcomputer 40 reads previously stored volume limit information from the memory which is located therein. Next, at step S2, the microcomputer 40 determines whether the modification of the previously stored volume limit information to new volume limit information is canceled by the operator. If so, the sound controlling operation is terminated, and if not, the control proceeds to step S3.

At step S3, the microcomputer 40 determines whether a volume-up routine is requested by the operator. If the volume-up routine is requested, the control proceeds to step S4, wherein the volume-up routine is performed and thereby the volume limit level MVL is increased one by one. If the volume-up routine is not requested, the control proceeds to step S5.

At step S5, the microcomputer 40 determines whether a volume-down routine is requested. If so, the control proceeds to step S6, wherein the volume-down routine is performed and thereby the volume limit level MVL is decreased one by one. If not, the control proceeds to step S7. At step S7, the microcomputer 40 determines whether the modified volume limit level is identical with the new volume limit information. If so, the control proceeds to step S8, wherein the microcomputer 40 stores the modified volume limit level therein. If not, the control jumps to step S2 wherein the above described process steps are repeated. According to the sound controlling method, a new volume limit level can be modified by an operator most adaptively to the incorporated software and/or the hardware.

Figure 6:
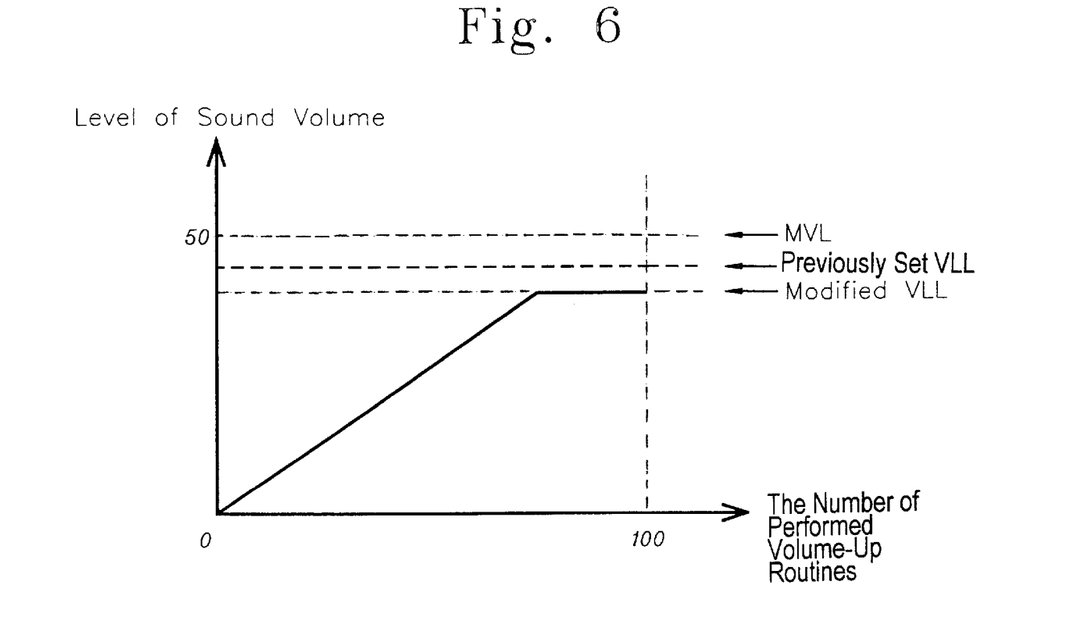
FIG. 6 is a graph showing the relationship between a sound volume level and the number of performed volume-up routines so as to explain the novel method according to the present invention.

FIG. 6 shows the relationship between a sound volume level and the number of performed volume-up routines so as to explain the novel sound controlling method according to the present invention. From FIG. 6, it can be seen that a previously set volume limit level is changed to a modified volume limit level which is relatively low to the previously set volume limit level by using the sound controlling method.

Figure 7:
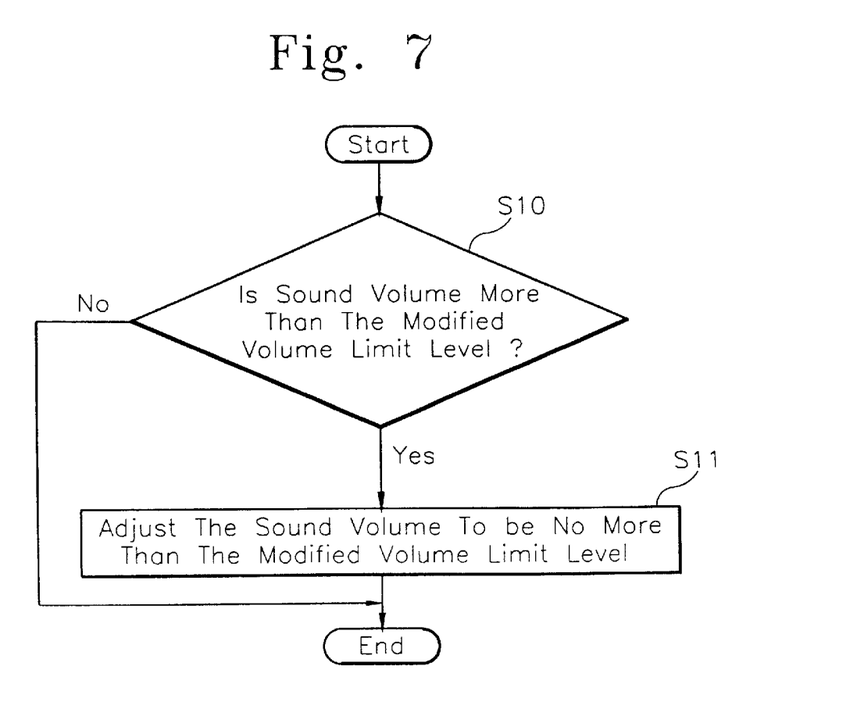
FIG. 7 is a flow chart showing the process steps of adjusting a sound volume after the sound controlling method is performed.

FIG. 7 shows, in flow chart form, the program of adjusting a sound volume which is stored in the memory of the microcomputer 40. This sound volume adjusting program is also performed in the microcomputer 40 after the volume limit level modifying program is executed, and is provided to reduce the sound volume. At step S10, if a mike is switched on, the microcomputer 40 checks whether the sound volume is more than the modified volume limit level. If so, the control proceeds to step S11, wherein the sound volume is adjusted to be no more than or equal to the modified volume limit level. If not, the sound volume adjusting program is terminated so that the present sound volume continues to be maintained.

Figure 8:
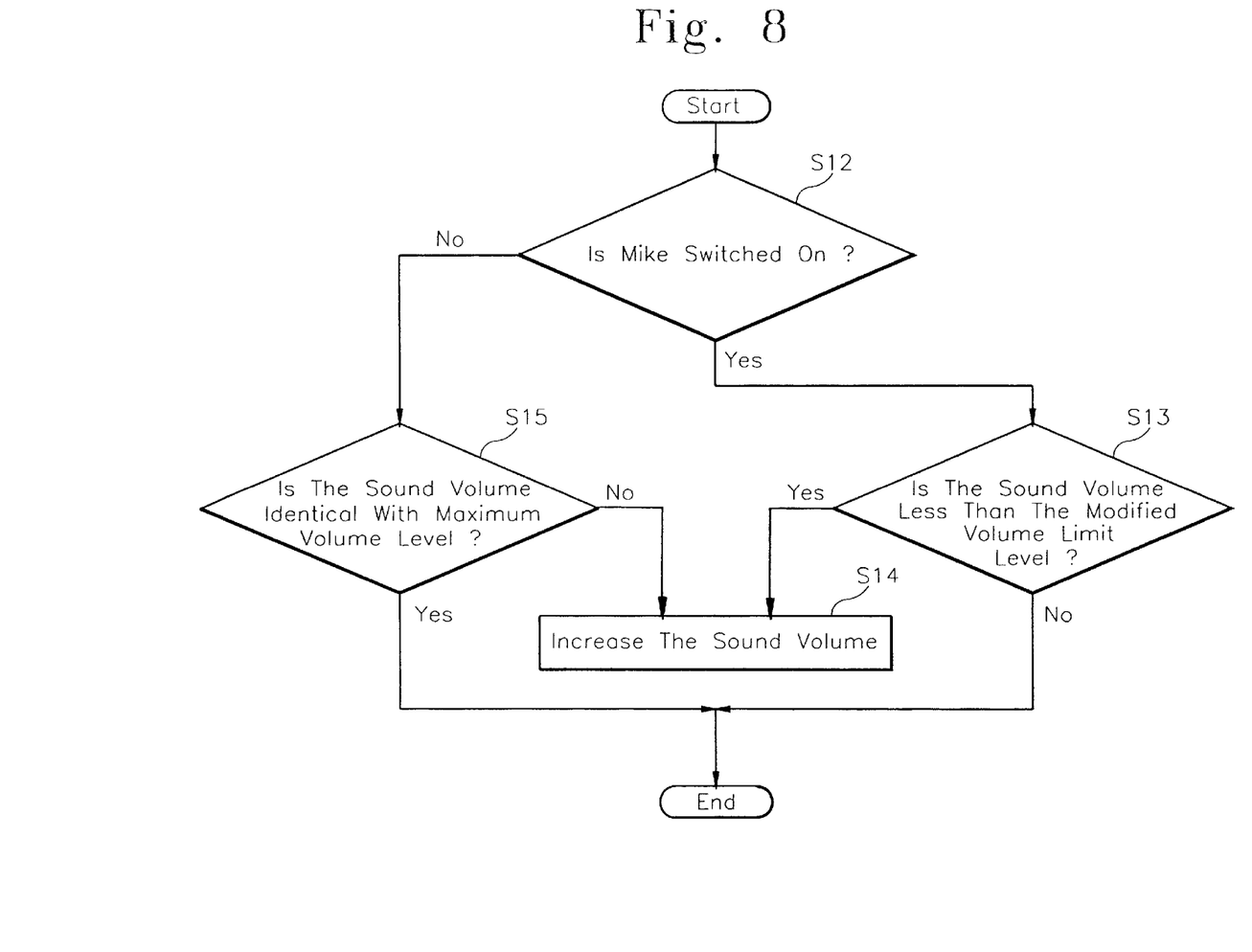
FIG. 8 is a flow chart showing the process steps of adjusting a sound volume after the sound controlling method is performed.

FIG. 8 shows, in flow chart form, another program of adjusting a sound volume which is stored in the memory of the microcomputer 40. This sound volume adjusting program is also performed in the microcomputer 40 after the volume limit level modifying program is executed Particularly, the sound volume adjusting program is provided to increase the sound volume. At step S12, the microcomputer 40 checks whether a mike is switched on. If so, the control proceeds to step S13, wherein the microcomputer 40 checks whether the present sound volume is less than the modified volume limit level. If the mike is switched off, the control proceeds to step S15, wherein the microcomputer 40 checks whether the present sound volume is identical with a maximum volume level.

If the present sound volume is less than the modified volume limit level at step S13, or if the present sound volume is identical with the maximum volume level, the sound volume adjusting operation is terminated so that the request of volume-up is neglected. If not, or if the present sound volume is identical with the maximum volume level, the control proceeds to step S14, wherein the sound volume is increased.

As described immediately above, according to a sound controlling method according to the present invention, a previously set volume limit level can be modified to a new volume limit level which does not occur howling, adaptive to the computer software and/or hardware in accordance with the adjustment of an operator. Accordingly, even though the different sorts of software and or chipset of sound card are located in a computer monitor in which the sound controlling method is incorporated, howling is not generated in the computer monitor by the modification of the previously set volume limit level to the new volume limit level.

What is claimed is:

1. A method of controlling sound in a computer monitor connected to a sound processing circuit with a microcomputer to compute with a microprocessor, said method comprising the steps of:

electronically reading previously stored volume limit information from a memory of said sound processing circuit when a volume limit level modifying signal is applied to said microcomputer in accordance with a key entry by an operator, said previously stored volume limit information indicating a volume limit level of sound to be emitted, the volume limit level modifying signal indicating a modification of said previously stored volume limit information to a new volume limit information;

determining whether the modification of said previously stored volume limit information to the new volume limit information is canceled;

when the modification of said previously stored volume limit information to the new volume limit information is canceled, terminating said sound controlling method;

when the modification of said previously stored volume limit information to the new volume limit information is not canceled, determining whether a volume-up operation is requested, said volume-up operation to raise the volume limit level;

when said volume-up operation is requested, performing said volume-up operation to raise the volume limit level to a modified volume limit level;

determining whether a volume-down operation is requested, said volume-down operation to lower the volume limit level;

when said volume-down operation is requested, performing said volume-down operation to lower the volume limit level to the modified volume limit level;

determining whether the modified volume limit level comports with said new volume limit information;

when said modified volume limit level comports with said new volume limit information, storing said modified volume limit level in said memory;

after storing said modified volume limit level, checking whether a microphone is turned on;

when the microphone is turned on, checking whether an output sound volume is less than said modified volume limit level;

when the microphone is not turned on, checking whether said output sound volume is identical with a maximum volume level;

when the microphone is turned on and the output sound volume is less than said modified volume limit level, increasing said output sound volume;

when the microphone is not turned on and the output sound volume is not identical with the maximum volume level, increasing said output sound volume;

when the microphone is turned on and the output sound volume is not less than said modified volume limit level, maintaining said output sound volume; and when the microphone is not turned on and the output sound volume is identical with the maximum volume level, maintaining said output sound volume.

2. A method of controlling sound in a computer monitor connected to a sound processing circuit with a microcomputer to compute with a microprocessor, said method comprising the steps of:

electronically reading previously stored volume limit information from a memory of said sound processing circuit when a volume limit level modifying signal is applied to said microcomputer in accordance with a key entry by an operator, said previously stored volume limit information indicating a volume limit level of sound to be emitted, the volume limit level modifying signal indicating a modification of said previously stored volume limit information to a new volume limit information;

determining whether the modification of said previously stored volume limit information to the new volume limit information is canceled;

when the modification of said previously stored volume limit information to the new volume limit information is canceled, terminating said sound controlling method;

when the modification of said previously stored volume limit information to the new volume limit information is not canceled, determining whether a volume-up operation is requested, said volume-up operation to raise the volume limit level;

when said volume-up operation is requested, performing said volume-up operation to raise the volume limit level to a modified volume limit level;

determining whether a volume-down operation is requested, said volume-down operation to lower the volume limit level;

when said volume-down operation is requested, performing said volume-down operation to lower the volume limit level to the modified volume limit level;

determining whether the modified volume limit level comports with said new volume limit information; and when said modified volume limit level comports with said new volume limit information, storing said modified volume limit level in said memory.

3. The method of claim 2, further comprising the steps of:

after storing said modified volume limit level, adjusting an output sound volume of said computer monitor.

4. The method of claim 3, wherein said step of adjusting said output volume comprises the steps of:

checking whether said output sound volume is more than said modified volume limit level when a microphone is turned on;

when said output sound volume is more than said modified volume limit level when a microphone is turned on, adjusting said output sound volume to be no more than or equal to said modified volume limit level; and when said output sound volume is not more than said modified volume limit level when a microphone is turned on, allowing said output sound volume to continue to be maintained.

5. The method of claim 2, further comprising the steps of:

after storing said modified volume limit level, checking whether a microphone is turned on;

when the microphone is turned on, checking whether an output sound volume is less than said modified volume limit level;

when the microphone is not turned on, checking whether said output sound volume is identical with a maximum volume level; and increasing said output sound volume.

6. An apparatus of controlling sound in a computer monitor connected to a sound processing circuit with a microcomputer to compute with a microprocessor, said apparatus comprising:

means for electronically reading previously stored volume limit information from a memory of said sound processing circuit when a volume limit level modifying signal is applied to said microcomputer in accordance with a key entry by an operator, said previously stored volume limit information indicating a volume limit level of sound to be emitted, the volume limit level modifying signal indicating a modification of said previously stored volume limit information to a new volume limit information;

means for determining whether the modification of said previously stored volume limit information to the new volume limit information is canceled;

means for terminating a sound controlling process when the modification of said previously stored volume limit information to the new volume limit information is canceled;

means for determining whether a volume-up operation is requested when the modification of said previously stored volume limit information to the new volume limit information is not canceled, said volume-up operation to raise the volume limit level;

means for performing said volume-up operation to raise the volume limit level to a modified volume limit level when said volume-up operation is requested;

means for determining whether a volume-down operation is requested, said volume-down operation to lower the volume limit level;

means for performing said volume-down operation to lower the volume limit level to the modified volume limit level when said volume-down operation is requested;

means for determining whether the modified volume limit level comports with said new volume limit information; and means for storing said modified volume limit level in said memory when said modified volume limit level comports with said new volume limit information.

7. The apparatus of claim 6, further comprising means for adjusting an output sound volume of said computer monitor after storing said modified volume limit level.

8. The apparatus of claim 7, wherein said means for adjusting said output volume comprises:

means for checking whether said output sound volume is more than said modified volume limit level when a microphone is turned on;

means for adjusting said output sound volume to be no more than or equal to said modified volume limit level when said output sound volume is more than said modified volume limit level when a microphone is turned on; and means for allowing said output sound volume to continue to be maintained when said output sound volume is not more than said modified volume limit level when a microphone is turned on.

9. The apparatus of claim 6, further comprising:

means for checking whether a microphone is turned on after storing said modified volume limit level;

means for checking whether an output sound volume is less than said modified volume limit level when the microphone is turned on;

means for checking whether said output sound volume is identical with a maximum volume level when the microphone is not turned on; and means for increasing said output sound volume.

10. The apparatus of claim 6, wherein the volume limit level is modified by the operator via a use of a computer software.

11. The apparatus of claim 6, wherein the volume limit level is modified by the operator via a use of a hardware device adaptable to a computer.

12. The apparatus of claim 11, wherein the hardware device comprises a sound card containing information regarding the volume limit level.

13. The apparatus of claim 6, wherein the microcomputer is controlled by a volume control circuit sending information regarding an output sound volume.

14. The apparatus of claim 13, wherein the volume control circuit operates in dependence upon the operating pressing a volume control button.

15. The apparatus of claim 6, wherein the volume limit level is increased and decreased by predetermined discrete steps.

* * * * *